United States Patent
Das et al.

(10) Patent No.: US 6,281,141 B1
(45) Date of Patent: Aug. 28, 2001

(54) PROCESS FOR FORMING THIN DIELECTRIC LAYERS IN SEMICONDUCTOR DEVICES

(75) Inventors: John H. Das, Freemont; Randhir P. S. Thakur, San Jose, both of CA (US)

(73) Assignee: Steag RTP Systems, Inc., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/246,821

(22) Filed: Feb. 8, 1999

(51) Int. Cl.[7] .......................... H01L 21/31; H01L 21/469
(52) U.S. Cl. ............................................. 438/770; 438/771
(58) Field of Search ..................................... 438/770, 771

(56) References Cited

U.S. PATENT DOCUMENTS

| | | |
|---|---|---|
| 3,623,712 | 11/1971 | McNeilly et al. . |
| 3,796,182 | 3/1974 | Rosler . |
| 3,830,194 | 8/1974 | Benzing et al. . |
| 3,862,397 | 1/1975 | Anderson et al. . |
| 4,047,496 | 9/1977 | McNeilly et al. . |
| 4,048,955 | 9/1977 | Anderson . |
| 4,081,313 | 3/1978 | McNeilly et al. . |
| 4,115,163 | 9/1978 | Gorina et al. . |
| 4,139,658 | 2/1979 | Cohen et al. . |
| 4,268,538 | 5/1981 | Toole et al. . |

(List continued on next page.)

FOREIGN PATENT DOCUMENTS

| | | |
|---|---|---|
| 4333160 A1 | 3/1995 | (DE) . |
| 0392134 A1 | 10/1990 | (EP) . |
| 0422653 A2 | 4/1991 | (EP) . |
| 0423761 A2 | 4/1991 | (EP) . |
| 0677703 A1 | 10/1995 | (EP) . |
| 0440154 B1 | 4/1996 | (EP) . |
| 2180989 | 5/1989 | (GB) . |

OTHER PUBLICATIONS

PCT International Search Report dated May 29, 2000.

Article by Mehrdad M. Moslehi, et al., entitled "Linearly ramped temperature transient rapid thermal oxidation of silicon", Applied Physics Letters, pp. 1104–1106, Sep. 19, 1988, New York.

Article by J. Nulman entitled "Thin High Quality Silicon Dioxide Films Grown by Rapid Thermal Processing", Journal of the Electrochemical Society, vol. 133, No. 3, Mar. 1986, Manchester, New Hampshire.

Article by W. Lerch, et al. entitled "Wet rapid thermal oxidation of silicon with a pyrogenic system", Materials Science and Engineering B, vol. B54, No. 3, pp. 153–160, 1998.

*Primary Examiner*—Ron Pompey
(74) *Attorney, Agent, or Firm*—Dority & Manning, P.A.

(57) ABSTRACT

A process for producing thin dielectric films is disclosed. In particular, the process is directed to forming oxide films having a thickness of less than about 60 angstroms. The oxide films can be doped with an element, such as nitrogen or boron. For example, in one embodiment, an oxynitride coating can be formed on a semiconductor wafer. According to the present invention, the very thin coatings are formed by reacting a gas with a semiconductor wafer while the temperature of the wafer is being increased in a rapid thermal processing chamber to a maximum temperature. According to the process, primarily all of the coating is formed during the "ramp up" portion of the heating cycle. Consequently, the wafer is maintained at the maximum target temperature for a very short period of time.

16 Claims, 6 Drawing Sheets

U.S. PATENT DOCUMENTS

| | | |
|---|---|---|
| 4,275,094 | 6/1981 | Takagi et al. . |
| 4,293,589 | 10/1981 | Takagi et al. . |
| 4,293,590 | 10/1981 | Takagi et al. . |
| 4,315,479 | 2/1982 | Toole et al. . |
| 4,446,817 | 5/1984 | Crawley . |
| 4,533,820 | 8/1985 | Shimizu . |
| 4,544,418 | 10/1985 | Gibbons . |
| 4,545,327 | 10/1985 | Campbell et al. . |
| 4,558,660 | 12/1985 | Nishizawa et al. . |
| 4,599,247 | 7/1986 | Bean et al. . |
| 4,604,304 | 8/1986 | Faraone et al. . |
| 4,640,224 | 2/1987 | Bunch et al. . |
| 4,649,261 | 3/1987 | Sheets . |
| 4,654,509 | 3/1987 | Robinson et al. . |
| 4,680,451 | 7/1987 | Gat et al. . |
| 4,694,143 | 9/1987 | Nishimura et al. . |
| 4,698,486 | 10/1987 | Sheets . |
| 4,796,562 | 1/1989 | Brors et al. . |
| 4,817,558 | 4/1989 | Itoh . |
| 4,822,642 | 4/1989 | Cabrera et al. . |
| 4,836,138 | 6/1989 | Robinson et al. . |
| 4,854,263 | 8/1989 | Chang et al. . |
| 4,857,139 | 8/1989 | Tashiro et al. . |
| 4,906,595 | 3/1990 | van der Plas et al. . |
| 4,920,918 | 5/1990 | Adams et al. . |
| 4,924,807 | 5/1990 | Nakayama et al. . |
| 4,956,538 | 9/1990 | Moslehi . |
| 4,975,561 | 12/1990 | Robinson et al. . |
| 5,000,113 | 3/1991 | Wang et al. . |
| 5,063,609 | 11/1991 | Lorimer . |
| 5,085,887 | 2/1992 | Adams et al. . |
| 5,129,360 | 7/1992 | Ahern et al. . |
| 5,148,714 | 9/1992 | Mcdiarmid . |
| 5,155,336 | 10/1992 | Gronet et al. . |
| 5,156,820 | 10/1992 | Wong et al. . |
| 5,160,545 | 11/1992 | Maloney et al. . |
| 5,179,677 | 1/1993 | Anderson et al. . |
| 5,183,775 | 2/1993 | Levy . |
| 5,188,058 | 2/1993 | Nakai . |
| 5,194,401 | 3/1993 | Adams et al. . |
| 5,207,835 | 5/1993 | Moore . |
| 5,215,588 | 6/1993 | Rhieu . |
| 5,227,328 | * 7/1993 | Khan et al. . |
| 5,234,504 | 8/1993 | Nakao et al. . |
| 5,244,501 | 9/1993 | Nakayama et al. . |
| 5,252,132 | 10/1993 | Oda et al. . |
| 5,252,366 | 10/1993 | Abern et al. . |
| 5,269,847 | 12/1993 | Anderson et al. . |
| 5,288,364 | 2/1994 | Burt et al. . |
| 5,300,460 | 4/1994 | Collins et al. . |
| 5,314,538 | 5/1994 | Maeda et al. . |
| 5,317,492 | 5/1994 | Gronet et al. . |
| 5,332,442 | 7/1994 | Kubodera et al. . |
| 5,348,587 | 9/1994 | Eichman et al. . |
| 5,364,667 | 11/1994 | Rhieu . |
| 5,366,554 | 11/1994 | Kanai et al. . |
| 5,367,606 | 11/1994 | Moslehi et al. . |
| 5,372,648 | 12/1994 | Yamomoto et al. . |
| 5,384,156 | 1/1995 | Belt et al. . |
| 5,434,090 | 7/1995 | Chiou et al. . |
| 5,444,217 | 8/1995 | Moore et al. . |
| 5,444,815 | 8/1995 | Lee et al. . |
| 5,445,675 | 8/1995 | Kubodera et al. . |
| 5,446,824 | 8/1995 | Moslehi . |
| 5,446,825 | 8/1995 | Moslehi et al. . |
| 5,449,883 | 9/1995 | Tsuruta . |
| 5,451,260 | 9/1995 | Versteeg et al. . |
| 5,455,204 | 10/1995 | Dobuzinsky et al. . |
| 5,482,557 | 1/1996 | Kanai et al. . |
| 5,487,127 | 1/1996 | Gronet et al. . |
| 5,493,987 | 2/1996 | McDiarmid et al. . |
| 5,501,739 | 3/1996 | Yamada et al. . |
| 5,505,779 | 4/1996 | Mizuno et al. . |
| 5,516,724 | 5/1996 | Ast et al. . |
| 5,525,160 | 6/1996 | Tanaka et al. . |
| 5,534,072 | 7/1996 | Mizuno et al. . |
| 5,551,982 | 9/1996 | Anderson et al. . |
| 5,551,985 | 9/1996 | Brors et al. . |
| 5,565,382 | 10/1996 | Tseng et al. . |
| 5,571,749 | 11/1996 | Matsuda et al. . |
| 5,576,059 | 11/1996 | Beinglass et al. . |
| 5,586,039 | 12/1996 | Hirsh et al. . |
| 5,587,019 | 12/1996 | Fujie . |
| 5,595,606 | 1/1997 | Fujikawa et al. . |
| 5,599,397 | 2/1997 | Anderson et al. . |
| 5,624,499 | 4/1997 | Mizuno et al. . |
| 5,633,202 | 5/1997 | Brigham et al. . |
| 5,633,212 | 5/1997 | Yuuki . |
| 5,635,409 | 6/1997 | Moslehi . |
| 5,643,633 | 7/1997 | Telford et al. . |
| 5,683,173 | 11/1997 | Gronet et al. . |
| 5,689,614 | 11/1997 | Gronet et al. . |
| 5,817,581 | * 10/1998 | Bayer et al. . |
| 5,840,610 | * 11/1998 | Gilmer et al. . |

\* cited by examiner

PROCESS FOR FORMING THIN DIELECTRIC LAYERS IN SEMICONDUCTOR DEVICES

FIELD OF THE INVENTION

The present invention is generally directed to a process for forming thin dielectric layers in semiconductor devices. More particularly, the present invention is directed to a process for forming thin dielectric layers on semiconductor wafers in rapid thermal processing chambers, wherein the layers are formed very quickly while the temperature of the wafer is being increased. In particular, the layers are formed during the "ramp up" portion of a heating cycle. Dielectric layers that may be formed according to the present invention include silicon dioxide layers that may be doped with a nitrogen specie.

BACKGROUND OF THE INVENTION

In general, an integrated circuit refers to an electrical circuit contained on a single monolithic chip containing active and passive circuit elements. Integrated circuits are fabricated by diffusing and depositing successive layers of various materials in a preselected pattern on a substrate. The materials can include semiconductive materials such as silicon, conductive materials such as metals, and low dielectric materials such as silicon dioxide. Of particular significance, the semiconductive materials contained in integrated circuit chips are used to form almost all of the ordinary electronic circuit elements, such as resistors, capacitors, diodes, and transistors.

Integrated circuits are used in great quantities in electronic devices, such as digital computers, because of their small size, low power consumption, and high reliability. The complexity of integrated circuits range from simple logic gates and memory units to large arrays capable of complete video, audio and print data processing. Presently, however, there is a demand for integrated circuit chips to accomplish more tasks in a smaller space while having even lower operating voltage requirements.

As stated above, integrated circuit chips are manufactured by successively depositing layers of different materials on a substrate. Typically, the substrate is made from a thin slice or wafer of silicon. The active and passive components of the integrated circuit are then built on top of the substrate. The components of the integrated circuit can include layers of different conductive materials such as metals and semi-conductive materials surrounded by low dielectric insulator materials. In attempting to improve integrated circuit chips, attention has been focused upon reducing the thickness of the layers while improving performance.

For instance, one area of circuit chip technology needing improvement is in the deposition of insulator or dielectric materials used in the chips. Such an insulator material should have a very high resistivity, as low as possible dielectric constant, and sustainability of subsequent process steps and materials used in chip manufacturing. The low dielectric insulator materials are incorporated into integrated circuits in order to reduce power dissipation when the circuit is in use.

Thin dielectric layers are being used routinely in the manufacturing of semiconductor devices for applications such as gates, capacitor dielectrics, besides various other uses. The most prevalent dielectric used in semiconductor devices is silicon dioxide, which can be formed through the reaction of oxygen and silicon at high temperature. Alternatively, steam can be reacted with silicon at high temperature to form silicon dioxide. In the past, silicon dioxide layers have been formed in conventional batch furnaces. Recently, as opposed to batch furnaces, such layers have also been formed in rapid thermal processing systems. The use of rapid thermal processing systems offers the advantages of short time high temperature processing which provides process advantages over using conventional furnaces.

In many advanced applications, silicon dioxide layers need to be doped with desired amounts of a dopant, such as a nitrogen specie, in order to improve the performance of the dielectric. The method by which the nitrogen dopant is incorporated into a silicon dioxide dielectric layer is complicated since it is necessary to control not only the concentration of nitrogen incorporated into the silicon dioxide but also its location within the oxide layer.

As described above, in order to produce advanced, fast acting devices, a need currently exists for producing dielectric layers having a minimal thickness. As the thickness of such dielectric layers decreases, however, significant difficulties arise in being able to properly and repeatably create thin nitrogen doped layers. In fact, even conventional 30 second to 120 second heating cycles conducted in rapid thermal processing chambers that are used to produce such layers become too long to provide controls sufficient to meet some of the requirements that are currently being specified.

Thus, a need currently exists for a process for producing thin dielectric layers that are uniform and that have improved electrical properties. A need also exists for a process for doping thin oxide layers. A need further exists for a rapid process for forming thin silicon dioxide layers doped with a nitrogen species.

SUMMARY OF THE INVENTION

The present invention recognizes and addresses the foregoing disadvantages, and others of prior art constructions and methods.

Accordingly, it is an object of the present invention to provide a process for depositing a material on a substrate.

Another object of the present invention is to provide a process for depositing a thin dielectric layer on a semiconductor wafer.

It is another object of the present invention to provide a process for producing very thin silicon dioxide layers on semiconductor wafers that are doped with a nitrogen species.

Still another object of the present invention is to provide a process for producing thin silicon dioxide layers that are doped with a nitrogen species and which are formed in a rapid thermal processing chamber.

Another object of the present invention is to provide a process for producing thin oxide layers in a rapid thermal processing chamber in which the layers are formed during the ramp up portion of the heating cycle within the chamber, meaning that the layers are formed while the temperature is being increased at a particular rate.

These and other objects of the present invention are achieved by providing a process for forming thin oxide coatings on a semiconductor device. The process includes the steps of placing a semiconductor wafer in a thermal processing chamber, such as a chamber heated using light energy. The semiconductor wafer is heated in the chamber such that the wafer is increased in temperature to a target temperature at a preselected rate. A reactive gas capable of forming an oxide coating on the wafer is circulated through the chamber. The gas is reacted with the semiconductor wafer to form an oxide coating on the wafer while the temperature of the wafer is being increased at the preselected rate to the target temperature. Prior to cooling, the wafer is maintained at the target temperature for a short period of time, such as less than about 2 seconds, and particularly for less than about 1 second. The oxide coating formed according to the present invention is very thin and can have a thickness of up to about 60 angstroms, and particularly from about 10 angstroms to about 50 angstroms, and more particularly from about 15 angstroms to about 40 angstroms.

In one embodiment, the gas circulated within the chamber can form a silicon dioxide coating on the wafer. For instance, the gas can contain molecular oxygen, steam, or mixtures thereof. The target temperature at which the wafer is heated can be from about 700° C. to about 1,200° C. and particularly from about 850° C. to about 1,150° C. The rate at which the wafer is heated can be an average rate of from about 10° C. per second to about 500° C. per second and particularly from about 50° C. per second to about 250° C. per second.

As opposed to conventional processes, the oxide layer is primarily formed while the wafer is being heated. In the past, typically most of the coating was formed while the wafer remained at a maximum target temperature. According to the present invention, since the coating is formed while the wafer is being heated to a target temperature, the wafer need only remain at the target temperature for a short period of time. Consequently, the process of the present invention produces coatings very quickly and which are ultra thin. Further, it has been discovered that the ultra thin coatings are produced with uniform formation and have very few defects.

In one particular embodiment of the present invention, oxynitride coatings can be formed. In this embodiment, the wafer is initially increased in temperature to a first target temperature at a first preselected rate while circulating a gas containing molecular oxygen, steam or a combination of molecular oxygen and steam. The gas reacts with the wafer to form an oxide coating while the temperature of the wafer is being increased at the first preselected rate to the first target temperature. As described above, the wafer can be maintained at the first target temperature for a short period of time, such as less than 2 seconds and the oxide coating can be very thin having a thickness of generally less than 60 angstroms.

After the oxide coating is formed, the wafer is cooled, such as being cooled to a temperature of less than about 700° C.

Once cooled, the semiconductor wafer can then be reheated. Specifically, the wafer can be increased in temperature to a second target temperature at a second preselected rate. Simultaneously, a gas containing a nitrogen compound can be contacted with the wafer while the wafer is being increased in temperature at the second preselected rate. The compound containing nitrogen can be, for instance, nitrogen dioxide, nitrogen oxide, molecular nitrogen mixed with molecular hydrogen or mixtures thereof. The nitrogen containing compound reacts with the oxide coating to form an oxynitride, such as silicon oxynitride. According to the present invention, the oxynitride is formed primarily while the wafer is being increased in temperature. In this manner, the nitride concentration and its location within the thin oxide layer can be controlled.

Optionally, the nitrogen concentration contained in the oxynitride film can be tailored by performing an additional reoxidizing step. In this embodiment, the oxynitride film is once again exposed to a gaseous compound containing oxygen while being heated. The reoxidation step can occur similar to the process described above while the wafer is being heated according to a preselected rate. Alternatively, the reoxidation step can occur using conventional controls, such as during a conventional rapid thermal processing cycle.

Other objects, features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figure, in which.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention which broader aspects are embodied in the exemplary construction.

In general, the present invention is directed to a process for forming coatings, particularly thin coatings, on semiconductor devices in thermal processing chambers. The semiconductor devices are coated by reacting the devices with a gas or gases entering the thermal processing chamber. In accordance with the present invention, the gas is reacted with the semiconductor device while the device is being heated at a preselected rate.

In the past, in conventional processes using rapid thermal processing chambers, dielectric coatings were typically formed on semiconductor wafers primarily after the wafers had been heated to a target temperature. Consequently, the wafer was maintained at the target temperature for an extended period of time. Conventional heating cycles typically lasted from 30 to 120 seconds. It has been discovered, however, that these heating cycles have become too long and do not provide enough controls sufficient to produce ultrathin coatings that are now being required by semiconductor chip manufacturers.

As opposed to conventional processes, dielectric coatings are formed according to the present invention while a semiconductor wafer is being increased in temperature according to a preselected rate or, in other words, during the "ramp up" portion of the heating cycle. It has been discovered by the present inventors that the process of the present invention produces thin films having improved electrical properties and quality. The process allows the use of high temperatures while providing the capability to form very thin films such as less than 60 angstroms. The films or coatings are produced extremely rapidly having a reduced thermal budget.

In one embodiment of the present invention, the process is used to form oxynitride films by first forming a silicon dioxide coating and then doping the silicon dioxide with a nitrogen species. Through the process of the present invention, the concentration and the location of the nitrogen species can be controlled while providing the capability of producing very thin films. Further, besides nitrogen, other elements can be diffused into the film. The diffusion is performed and controlled without exceeding the thickness requirements that are now currently needed. Various other benefits and advantages will be made apparent from the following description.

The process of the present invention is designed to be carried out in a thermal processing chamber. For instance, referring to FIG. 1, one embodiment of a thermal processing chamber (20) is shown.

Figure 1:
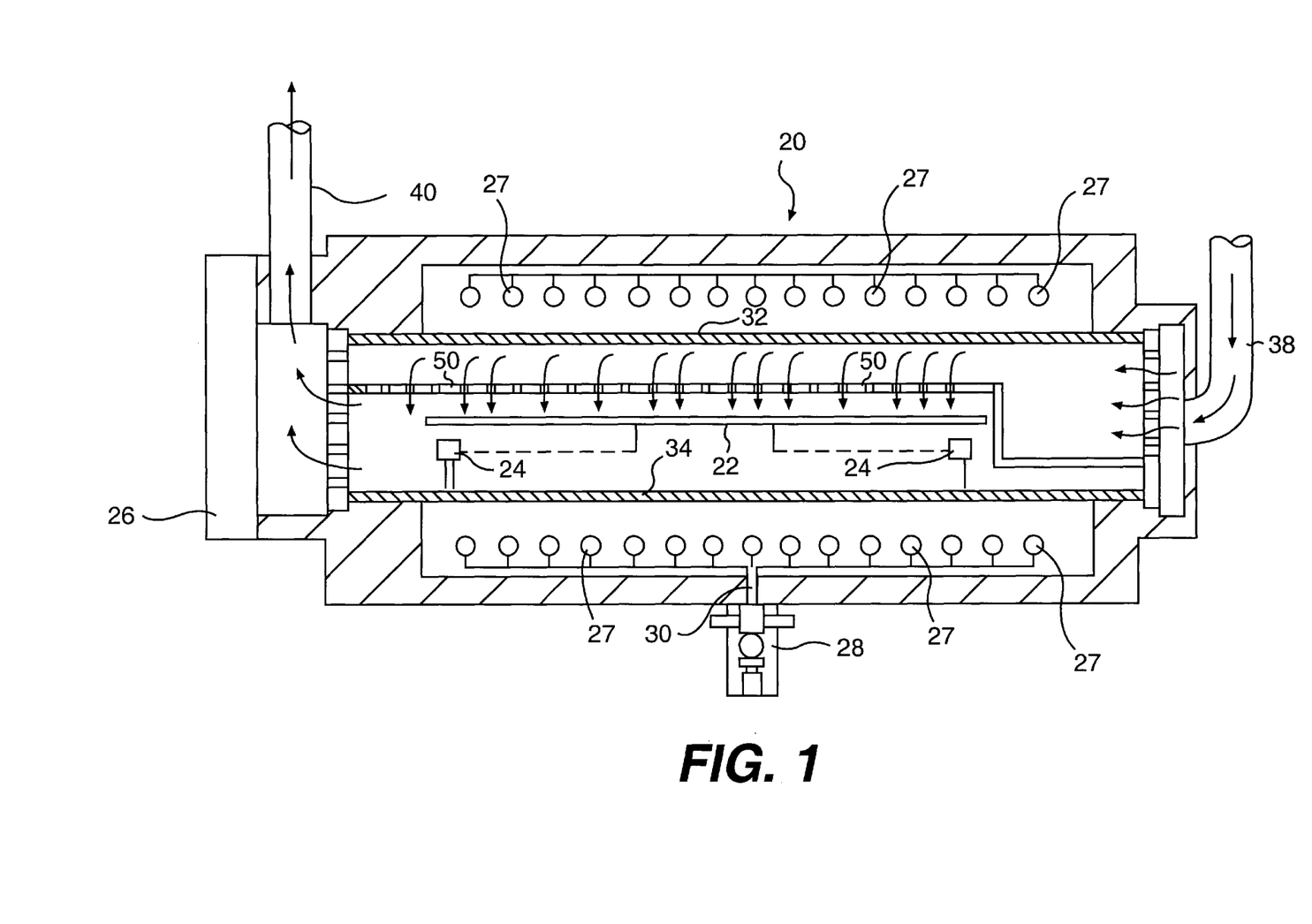
FIG. 1 is a cross sectional view of one embodiment of a thermal processing chamber that can be used in the process of the present invention.

Thermal processing chamber (20) is adapted to receive a semiconductor wafer (22), for conducting various processes. In particular, thermal processing chamber (20) is designed to heat wafer (22) at very rapid rates and under carefully controlled conditions. Semiconductor wafers are loaded into and out of chamber (20) through a door (26).

Thermal processing chamber (20) can be made from various materials including metals and ceramics. In one embodiment of the present invention, chamber (20) includes interior walls made from a nonconductive material, such as quartz. For most applications, walls made from a nonconductive material such as quartz are preferred. For instance, metal walls can corrode when exposed to some of the gases that are fed through the chamber. Further, metal can leak and contaminate the chamber. Similar problems are not experienced with quartz walls. Further, quartz walls prevent condensation of high temperature steam.

As shown, wafer (22) is positioned within thermal processing chamber (20) on a substrate holder (24). During processing, substrate holder (24), in one embodiment, can be adapted to rotate wafer (22). Rotating the wafer promotes greater temperature uniformity over the surface of the wafer and promotes enhanced contact between wafer (22) and the gas being circulated through the chamber. It should be understood, however, that besides wafers, thermal processing chamber (20) is also adapted to process optical parts, films, fibers, ribbons, and other substrates having any particular shape.

In order to heat wafer (22), the system of the present invention includes a heat source in communication with thermal processing chamber (20). In the embodiment illustrated, the heat source comprises a plurality of lamps (27), such as tungsten-halogen lamps. The lamps can be positioned above and below wafer (22) as shown in the figure, or can be placed only above or only below the wafer. Further, if desired, lamps (27) can be surrounded by a reflector or a set of reflectors for directing thermal energy being emitted by the lamps onto wafer (22) at particular locations. Besides being placed above and below wafer (22), lamps (27) may be positioned at any other location within the thermal processing chamber.

The use of lamps (27) as a heat source is generally preferred. For instance, lamps have much higher heating and cooling rates than other heating devices, such as electrical elements or conventional furnaces. Lamps (27) create a rapid thermal processing system that provides instantaneous energy, typically requiring a very short and well controlled startup period. The flow of energy from lamps (27) can also be abruptly stopped at any time. Lamps (27) can be equipped with a gradual power controller that can be used to increase or decrease the thermal energy being emitted by the lamps.

In order to monitor the temperature of wafer (22) during operation of thermal processing chamber (20), a temperature sensing device, such as a radiation sensing device (28) is included. Radiation sensing device (28), which can be, for instance, a pyrometer, includes an optical fiber or light pipe (30) which extends from radiation sensing device (28) adjacent to wafer (22).

Light pipe (30) is configured to receive thermal energy being emitted by wafer (22) at a particular wavelength. The amount of sensed radiation is then communicated to radiation sensing device (28) which generates a usable voltage signal for determining the temperature of the wafer. In particular, by knowing the amount of thermal radiation being emitted by wafer (22) at a particular wavelength, the temperature of the object can be calculated based, in part, on Planck's Law.

During the process, light pipe (30) should only detect thermal radiation being emitted by wafer (22) and should be prevented from detecting thermal radiation being emitted by lamps (27) at the desired wavelength. In this regard, thermal processing chamber (12) can include spectral filters (32) and (34) which are positioned between lamps (27) and the end of light pipe (30). Spectral filters (32) and (34) are designed to filter out thermal radiation being emitted by lamps (27) which is at the wavelength at which radiation sensing device (28) operates. For instance, in one embodiment, spectral filters (32) and (34) can be made from fused silicon or quartz.

It should be understood that besides containing a single radiation sensing device (28), thermal processing chamber (20) can include a plurality of radiation sensing devices positioned at different locations. Further, besides using pyrometers or in addition to using pyrometers, thermal processing chamber (20) can contain thermocouples which monitor the temperature of the wafer.

Preferably, the temperature sensing device is connected to a controller which controls the amount of light energy being emitted by lamps (27). In this manner, the amount of light energy being emitted by the lamps can be controlled directly in relation to the temperature of the wafer.

In accordance with the present invention, thermal processing chamber (20) further includes a gas inlet (38) and a gas outlet (40) for circulating one or more gases into the chamber. For instance, one or more gases can be introduced into thermal processing chamber (20) containing a gaseous reactant which is designed to react with semiconductor wafer (22) for depositing a film or coating on the surface of the wafer. If desired, the gas or gases entering thermal processing chamber (20) can be preheated.

Further, in one embodiment, gases entering the chamber can be uniformly dispersed over the surface of the wafer in order to promote a uniform reaction. For instance, thermal processing chamber (20) can include a dispersing device that directs and disperses the gas over the surface of the wafer where the reaction is intended to occur. For example, as shown in FIG. 1, in one embodiment, a perforated plate (50)

is positioned over the top surface of semiconductor wafer (22). Perforated plate (50) includes a plurality of holes through which the gas is directed prior to contacting the wafer. By distributing the gas evenly over the wafer surface, the process produces a film having a more uniform thickness and promotes a uniform temperature distribution throughout the wafer.

It should be understood, however, that the perforated plate (50) is optional. Thus, in one embodiment, the gas or gases being fed to the chamber can simply flow over the surface of the wafer.

Figure 2:
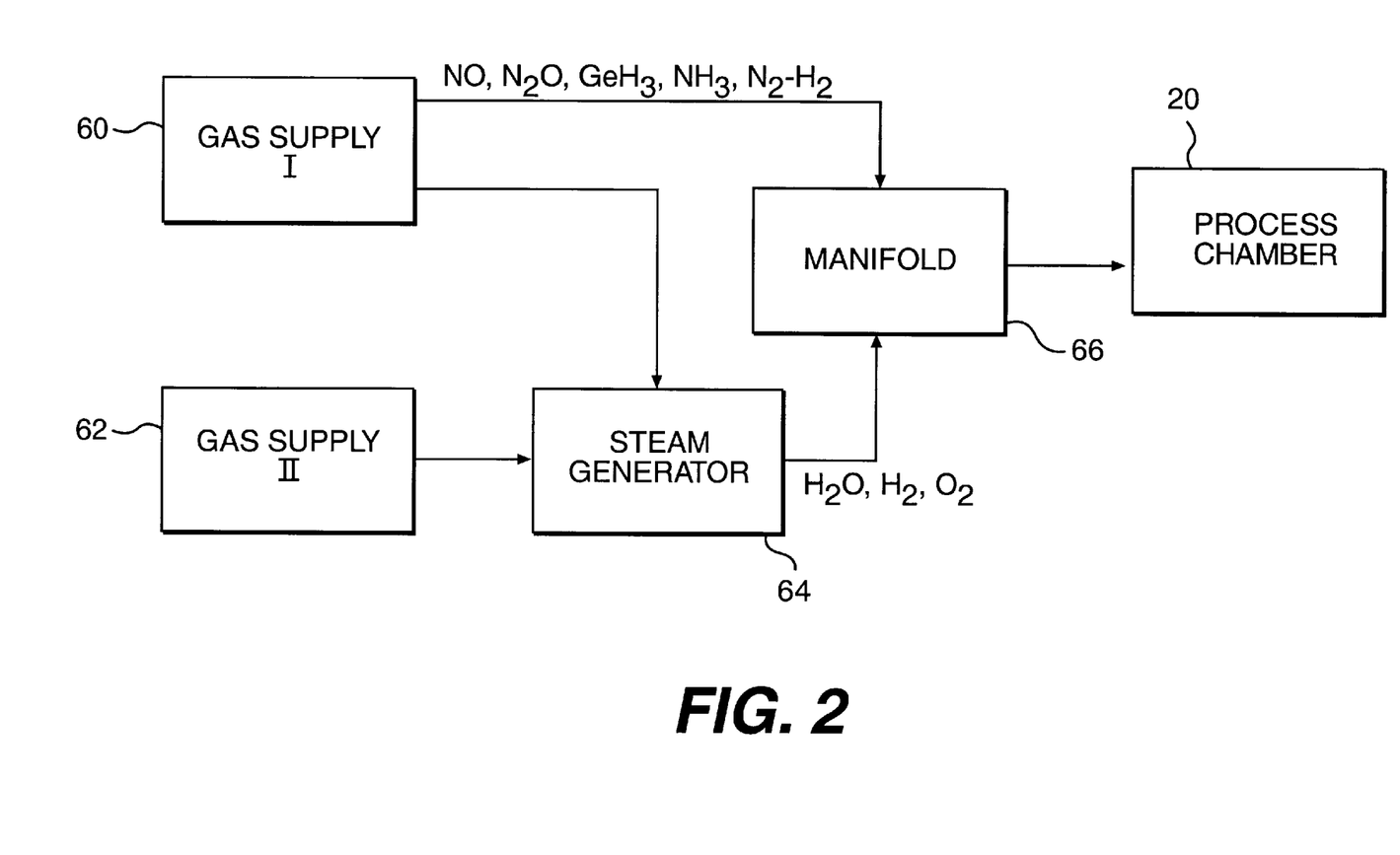
FIG. 2 is a plan view of one embodiment of a processing system that can be used in the process of the present invention.

One embodiment of a system that can be used to feed gases into thermal processing chamber 20 is illustrated in FIG. 2. As shown in the figure, in this embodiment, the system includes a first gas supply 60 and a second gas supply 62. More than one gas supply may be needed in some processes where more than one gas is being fed to the chamber, especially if those gases are reactive with each other.

As shown, gas supply 60 and gas supply 62 are in communication with a steam generator 64. Steam generator 64 is included in the system in order to generate steam for carrying out steam oxidation processes within processing chamber 20, or any other processes that require the presence of steam.

In order to regulate the flow of gases into thermal processing chamber 20, the system illustrated in FIG. 2 further includes a manifold 66. Manifold 66 can be capable of adjusting flow rates and ensuring that the proper mixture of gases is fed to the chamber. For exemplary purposes only, as shown in FIG. 2, such gases as water, hydrogen, oxygen, nitrous oxides, nitrogen, $GeH_3$ and $NH_3$ can be fed to the processing chamber for carrying out desirable reactions in order to, for instance, form various coatings on semiconductor wafers.

As described above, the process of the present invention is generally directed to reacting gases with a semiconductor wafer contained within chamber (20) in a manner that produces very thin dielectric coatings very quickly. In particular, the present invention is directed to forming oxide coatings that may or may not be doped with a dopant, such as nitrogen. The present invention is directed to shortening the oxidation cycle to the minimum by forming the coatings while the temperature of the wafer is being increased in the chamber. For instance, the coating is primarily formed during the "ramp up" portion of the heating cycle, prior to the temperature of the wafer reaching a maximum. In this manner, the maximum temperature of the wafer is only maintained for a short period of time, such as less than about 2 seconds, prior to cooling the wafer. According to the process of the present invention, very thin dielectric coatings can be formed having excellent film quality and improved electrical properties.

For example, in one embodiment of the present invention, a very thin silicon dioxide coating is formed on a silicon wafer. The process can include the steps of first preparing a silicon wafer by cleaning a surface of the wafer. The surface can be cleaned using either a wet or dry cleaning process as is known in the art. For instance, an acid such as hydrogen fluoride, or a plasma may be used. Cleaning the wafer removes native oxide, contaminates and dust from the surface. The surface of the silicon wafer is preferably cleaned in order to reduce defects in the film to be formed.

Once the silicon surface is prepared, the wafer is heated so that the temperature of the wafer is increased at a particular rate to a maximum target temperature. The rate at which the temperature of the wafer is increased can be linear, can be approximately linear, or can be exponential. For most applications, the rate at which the temperature increases can be an average rate of from about 10° C. per second to about 500° C. per second, particularly from about 50° C. per second to about 250° C. per second and in one embodiment at an average rate of about 70° C. per second.

At a rate within the above described range, the wafer is heated to a maximum target temperature sufficient to form an oxide coating. The maximum temperature may depend upon the pressure within the rapid thermal processing chamber. In general, the rapid thermal processing chamber can operate at atmospheric pressure or at a pressure lower than atmospheric pressure. For most applications, the wafer is heated to a temperature of from about 700° C. to about 1,200° C. and particularly from about 800° C. to about 1,150° C.

According to the process of the present invention, simultaneously while the temperature of the wafer is being increased, a gaseous reactant is contacted with the wafer for forming an oxide layer. The gaseous reactant can be molecular oxygen, steam, or mixtures thereof in order to form a silicon dioxide coating on the silicon wafer.

The coating can be completely formed during the "ramp up" phase of the heating cycle such that the wafer is only maintained at the maximum target temperature for a very short period of time. For instance, according to the present invention, the wafer can be maintained at the target temperature for less than about 2 seconds, and particularly less than about 1 second prior to cooling the wafer.

Through the above process, very thin oxide coatings can be formed having excellent electrical properties. The coatings, for instance, can have a thickness of less than 60 angstroms, particularly from about 10 angstroms to about 50 angstroms, and more particularly from about 15 angstroms to about 40 angstroms.

In one embodiment of the present invention, an oxide coating formed according to the above process can then be doped with a dopant, such as nitrogen. For instance, in one embodiment, an oxide film as formed above can be doped with a nitrogen species to form an oxynitride, particularly silicon oxynitride.

In this embodiment, after the oxide coating is formed, the wafer is cooled to a temperature of, for instance, less than 700° C. The wafer can be cooled according to an average rate similar to the rate at which the wafer is heated. Once cooled to a particular temperature, the wafer is then immediately reheated in the thermal processing chamber. Once again, the wafer is heated at an average rate as described above, such as at an average rate of from about 10° C. per second to about 500° C. per second, and particularly from about 50° C. per second to about 250° C. per second. At this rate, the wafer is heated to a maximum temperature of from about 800° C. to about 1,200° C. According to the present invention, while the wafer is being heated, the wafer is contacted with a gas containing a compound containing nitrogen. For instance, the gas can contain dinitrogen oxide, nitrogen oxide, ammonia, a mixture of molecular nitrogen and molecular hydrogen, or mixtures thereof. The nitrogen compound reacts with the wafer to form an oxynitride.

Figure 3:
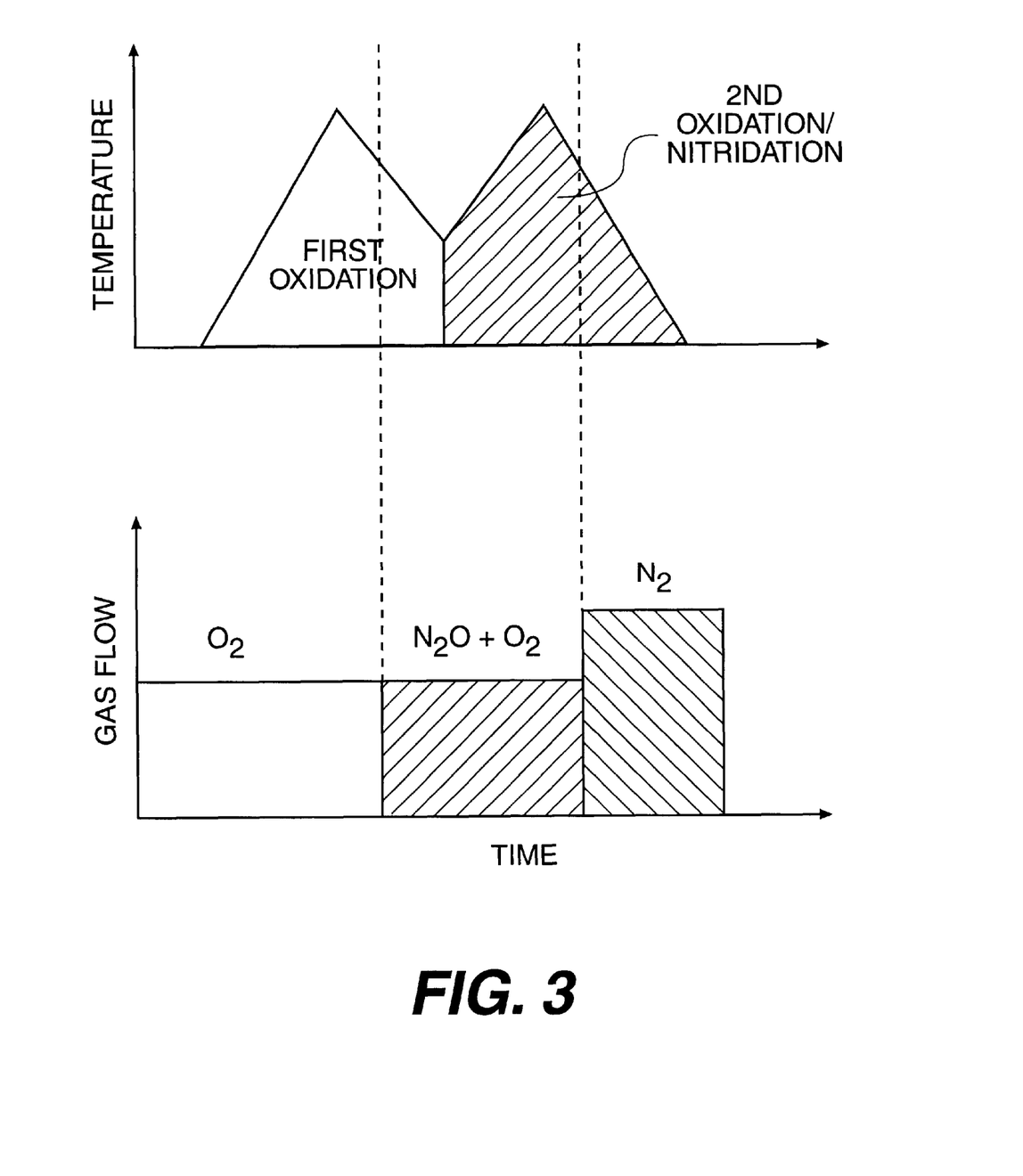
FIG. 3 is a temperature and flow sequence diagram of one embodiment of a process carried out in accordance with the present invention.

Referring to FIG. 3, one embodiment of a process for forming an oxynitride coating in accordance with the present invention is illustrated. In particular, FIG. 3 is a temperature and flow sequence diagram for an oxynitride process.

As shown, a first oxidation step is carried out during which the temperature of a semiconductor wafer is heated to a maximum temperature and then is immediately cooled. During the first oxidation step, in this embodiment, molecular oxygen is fed to the thermal processing chamber. As shown, the molecular oxygen is fed to the thermal processing chamber during the entire heating phase and during a portion of the cooling phase.

Next, as shown in FIG. 2, an oxidation/nitridation step is then carried out. While the wafer is cooling after the first oxydation step, the flow of molecular oxygen is reduced and the flow of dinitrogen oxide is commenced. In particular, in this embodiment, dinitrogen oxide is fed to the chamber during the remainder of the cooling phase of the first oxidation step, while the wafer is again reheated to a maximum temperature, and during a portion of the cooling phase of the oxidation/nitrogation step. During the remainder of the cooling phase of the oxidation/nitrogation step, the flow of dinitrogen oxide and oxygen is stopped while the flow of molecular nitrogen is commenced. Molecular nitrogen simply serves as an inert gas during the remainder of the cooling phase.

The amount of each gas that is fed to the thermal processing chamber during the process generally depends upon the size of the chamber and the size of the wafer that is being treated. For most applications, the gas flow rate of each of the gases that are fed to the chamber can range from about 1 liter per minute to about 20 liters per minute. As shown in FIG. 3, generally, for most applications, the gas flow rate during the process is not held constant but is increased or decreased depending upon the particular gas that is being fed to the chamber.

It has been discovered that the process of the present invention provides controls over the concentration of nitrogen incorporated into the coating on the semiconductor wafer and over the location of where the nitrogen is reacted. Of particular importance, oxynitride coatings can be formed having very thin thicknesses. Further, the process occurs very rapidly wherein most if not all of the reaction occurs while the temperature of the wafer is being increased. Thus, the temperature is only maintained at its maximum target temperature for a very short period of time, such as less than about 2 seconds.

Once the oxide film is doped with a nitrogen species according to the present invention, the wafer can then be cooled at a desired rate prior to being subjected to any further processes.

Figure 4:
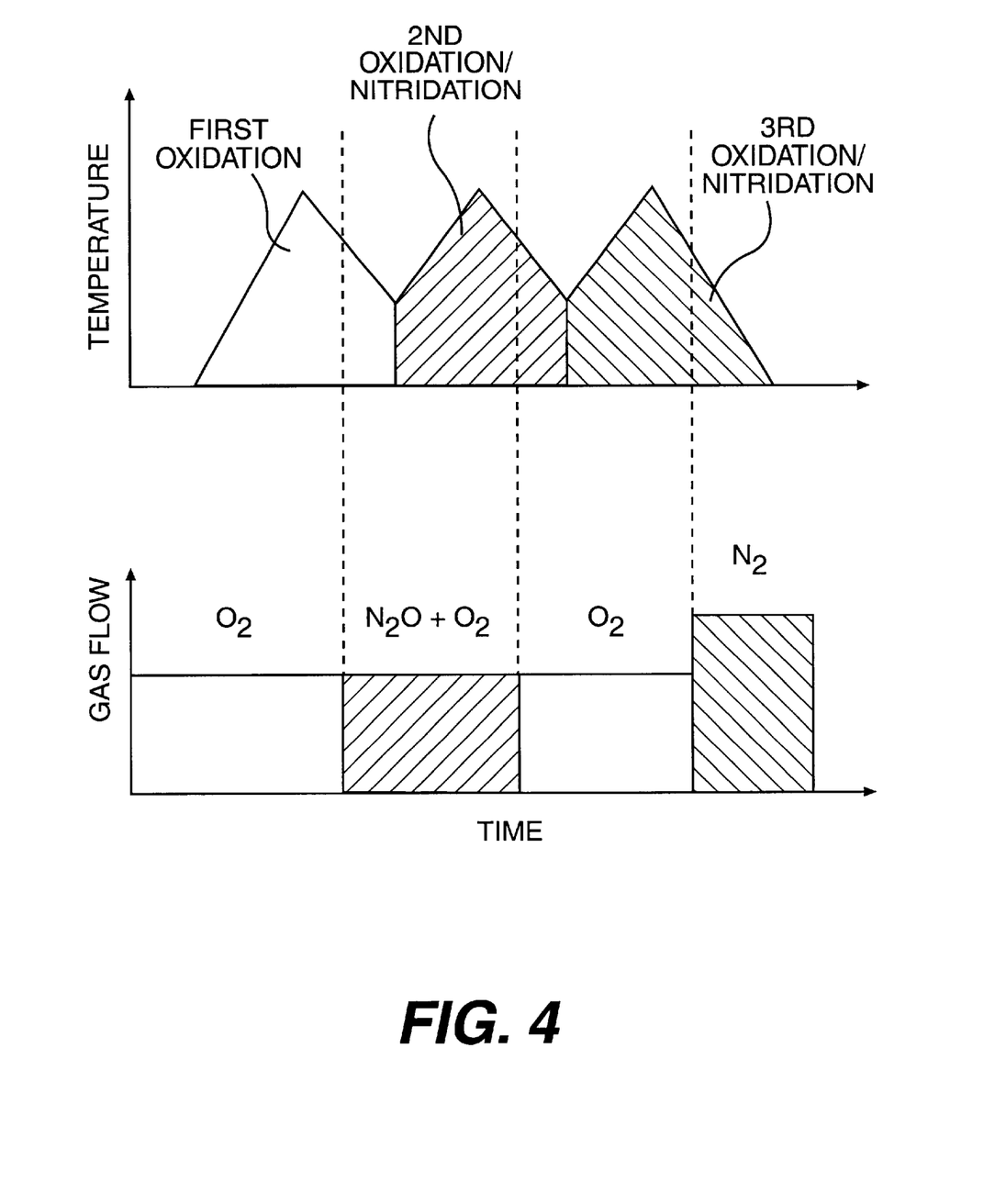
FIG. 4 is a temperature and flow sequence diagram for an alternative embodiment of a process carried out according to the present invention.

In one alternative embodiment of the present invention, as shown in FIG. 4, after the oxide film is doped with the nitrogen species, a reoxidation step can be performed on the film in order to tailor the nitrogen concentration within the film. The reoxidizing step can be performed according to the above described process of initially forming the oxide film. Alternatively, the reoxidation step can be performed according to a conventional heating cycle wherein the wafer is heated to a maximum temperature and held at the maximum temperature until the reaction is complete.

Referring to FIG. 4, one embodiment of a process for forming an oxynitride coating which includes a reoxidation step is illustrated. As shown, the first oxidation step and the oxidation/nitridation step are similar to the process illustrated in FIG. 3. In FIG. 4, however, after the flow of dinitrogen oxide is discontinued, molecular oxygen is fed to the chamber and the wafer is again heated to a maximum temperature in order to reoxidize the wafer. Molecular oxygen is fed to the chamber until the wafer obtains a maximum temperature and is then partially cooled. After being partially cooled, the flow of molecular oxygen is ceased and replaced with the flow of molecular nitrogen until the wafer is completely cooled. Similar to the embodiment shown in FIG. 3, molecular nitrogen acts as an inert gas during the cool down phase.

Of particular advantage with respect to the processes illustrated in FIGS. 3 and 4, oxynitride coatings are formed on the semiconductor wafer during a substantially continuous process. Further, since most of the reaction occurs while the wafer is being heated, the wafer is not maintained at its maximum temperature for any appreciable length of time, which reduces the overall time it takes to form the coatings and process the wafers.

Besides the embodiments illustrated in FIGS. 3 and 4, in a further alternative embodiment, a gas containing an oxygen source and a gas containing a nitrogen source can be fed simultaneously to the thermal processing chamber in order to form an oxinitride coating during a single heating cycle. For example, molecular oxygen and dinitrogen oxide can be fed to a thermal processing chamber containing a semiconductor wafer simultaneously. While the gases are being fed to the chamber, the wafer can be heated to a maximum temperature and then immediately cooled. During the cooling phase, the flow of oxygen and dinitrogen oxide can be discontinued and replaced with the flow of an inert gas. During this cycle, a very thin oxynitride coating can be formed in accordance with the present invention.

The relative gas concentration being fed to the thermal processing chamber during the process of the present invention will vary depending upon the particular application and the desired result. In general, when forming an oxynitride coating in one of the embodiments described above, the ratio of oxygen to dinitrogen oxide can be from about 2 to 1 to about 1 to 1. Excess dinitrogen oxide may cause nonuniformities in the thickness of the coating. During these processes, nitrogen can be incorporated into the oxide coating at an atomic concentration of up to about 10%, and particularly from about 2% to about 6%.

When incorporated into an oxide coating, nitrogen accumulates at the silicon/silicon dioxide interface forming a diffusion barrier, preventing diffusion of impurities into the silicon. For instance, the oxynitride coating has been found well suited for preventing boron which may be present within the integrated circuit from diffusing into the silicon and adversely affecting the characteristics of the circuit.

The present invention may be better understood with reference to the following example.

EXAMPLE

The following example demonstrates various advantages of the present invention.

Eight (8) inch silicon wafers were placed in a thermal processing chamber similar to the one shown in FIG. 1 and heated. While being heated, oxygen was circulated through the chamber at a flow rate of 3 liters per minute. The wafers were heated to a temperature of 1,050° C. causing a silicon oxide layer to form on the wafer.

Nine (9) different wafers were treated. Each wafer was heated according to a different ramp rate. The ramp rates varied from 30° C. per second to 100° C. per second. Once the wafers reached a temperature of 1,050° C., the temperature was maintained for 1 second and thereafter the wafers were allowed to cool.

After being heated, the thickness of the silicon oxide layer that was formed was measured at 49 locations. The results are graphically illustrated in FIGS. 5 and 6.

Figure 5:
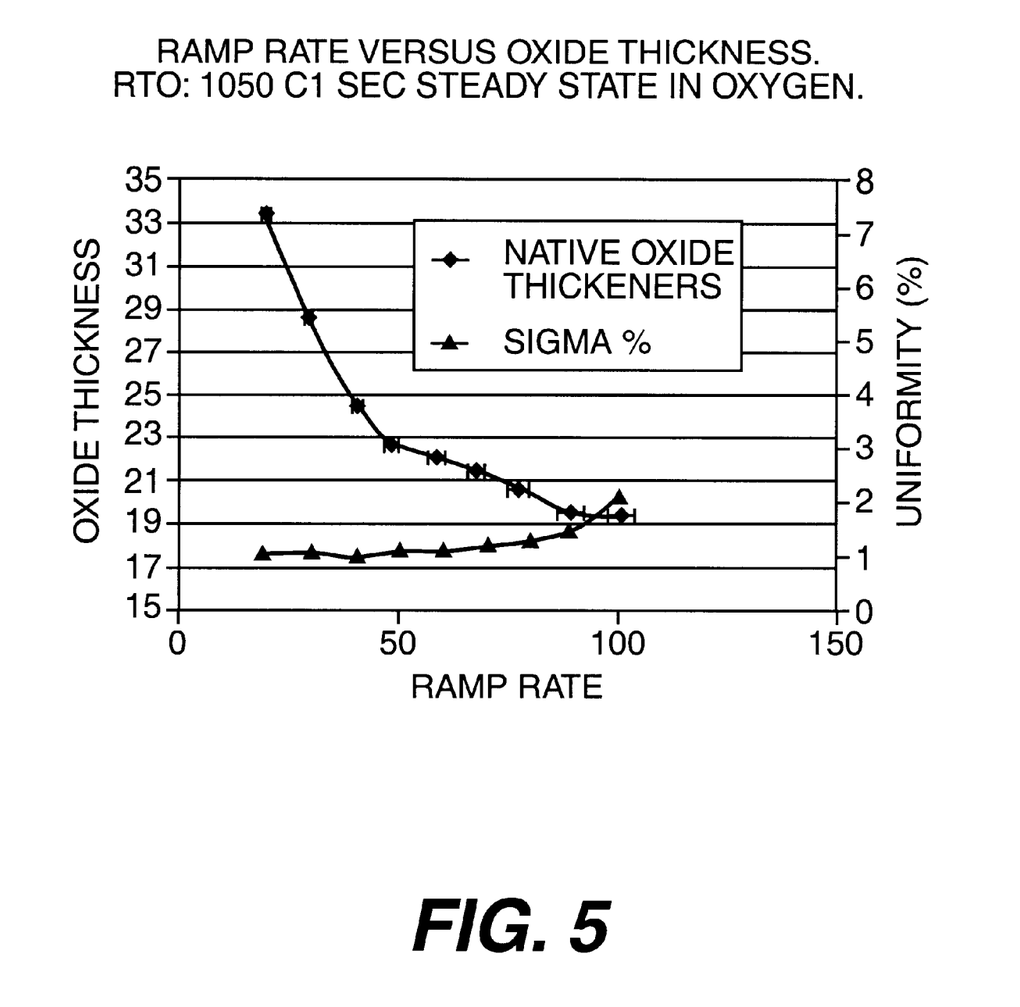
FIG. 5 is a graphical representation of the results obtained in the Example.

FIG. 5 illustrates the thickness of the oxide film that was grown based upon the ramp rate that was used. FIG. 5 also illustrates the thickness uniformity of the oxide film based upon the standard deviation calculated for each film. As shown, as ramp rate increased, oxide thickness decreased. Of particular advantage, very thin films were grown that were very uniform in thickness.

Figure 6:
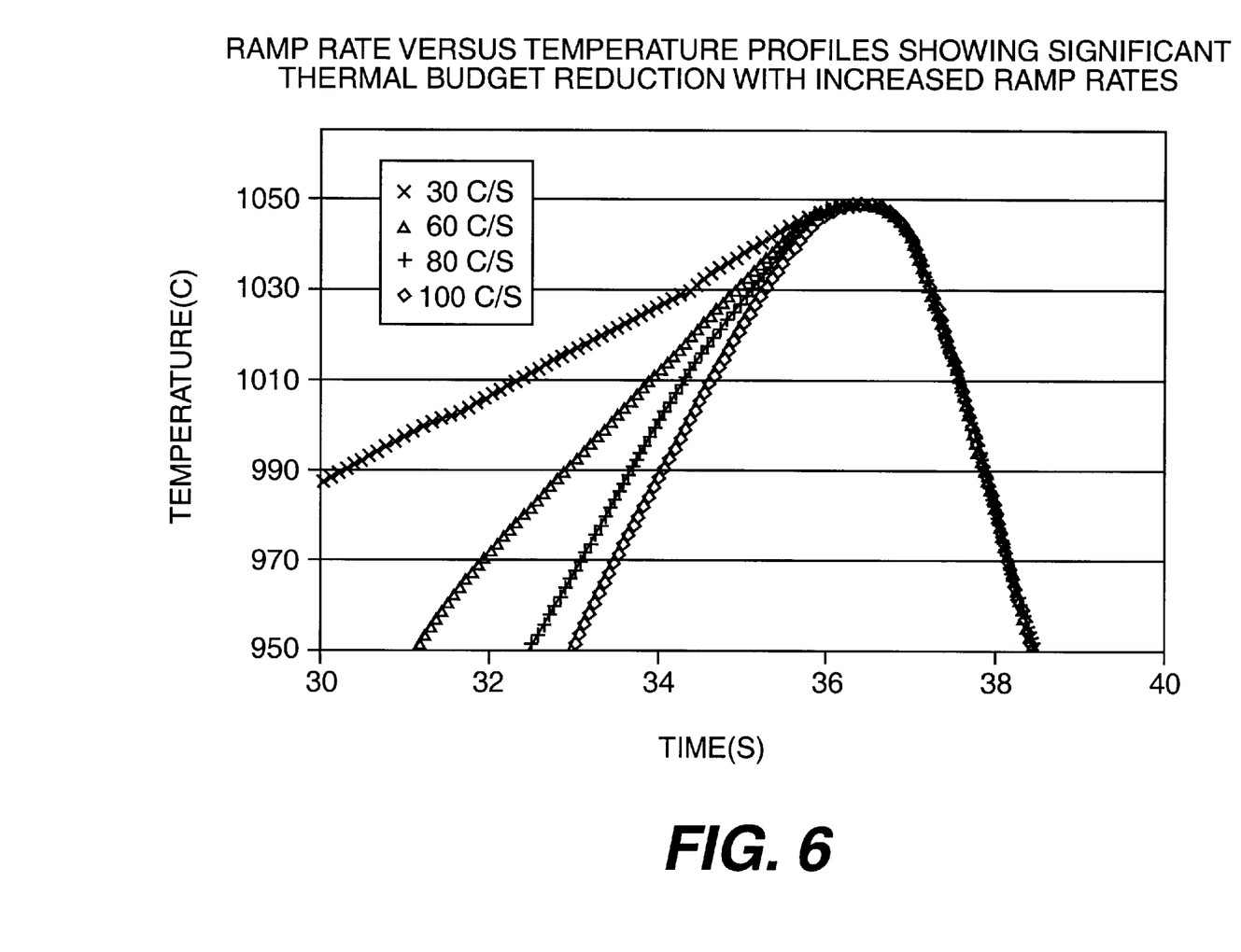
FIG. 6 is a graphical representation of the results obtained in the Example.

FIG. 6, on the other hand, is a graphical representation of time versus temperature profiles for selected ramp rates that were used during the experiment. As shown, as ramp rates increased, the thermal budget of the system was reduced.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A process for forming thin oxide coatings on a semiconductor device, said process comprising the steps of:

placing a semiconductor wafer in a thermal processing chamber;

heating said semiconductor wafer in said chamber, said wafer being increased in temperature to a first target temperature at a first preselected rate;

circulating a first gas within said chamber, said first gas containing an oxygen compound;

reacting said first gas with said semiconductor wafer to form an oxide coating while the temperature of said semiconductor wafer is being increased at said first preselected rate to said first target temperature, wherein said wafer is maintained at said first target temperature for less than about 2 seconds, said oxide coating having a thickness of up to about 60 angstroms;

cooling said semiconductor wafer;

reheating said semiconductor wafer in said chamber, said wafer being increased in temperature to a second target temperature at a second preselected rate;

circulating a second gas within said chamber, said second gas containing a nitrogen compound; and reacting said second gas with said oxide coating to form an oxynitride while the temperature of said semiconductor wafer is being increased at said second preselected rate to said second target temperature, wherein said wafer is maintained at said second target temperature for less than about 2 seconds.

2. A process as defined in claim 1, wherein said first gas comprises a material selected from the group consisting of molecular oxygen, steam, and mixtures thereof.

3. A process as defined in claim 1, wherein said second gas comprises a material selected from the group consisting of dinitrogen oxide, nitrogen oxide, ammonia, molecular nitrogen and mixtures thereof.

4. A process as defined in claim 1, wherein said first preselected rate and said second preselected rate are average rates of from about 50° C. per second to about 250° C. per second.

5. A process as defined in claim 1, wherein said first target temperature and said second target temperature range from about 700° C. to about 1,200° C.

6. A process as defined in claim 1, wherein said oxide coating has a thickness of from about 10 angstroms to about 50 angstroms.

7. A process as defined in claim 1, further comprising the steps of:

subsequently cooling said semiconductor wafer after forming said oxynitride; and reoxidizing said semiconductor wafer by reacting said wafer with oxygen.

8. A process as defined in claim 7, wherein said reoxidation process comprises the steps of:

reheating said semiconductor wafer in said chamber, said wafer being increased in temperature to a third target temperature at a third preselected rate;

circulating a compound containing oxygen within said chamber; and reacting said compound containing oxygen with said semiconductor wafer while the temperature of said semiconductor wafer is being increased at said third preselected rate to said third target temperature, wherein said wafer is maintained at said third target temperature for less than about 2 seconds.

9. A process as defined in claim 1, wherein said semiconductor wafer is heated to a temperature of less than about 600° C. prior to reheating said wafer and reacting said wafer with said second gas.

10. A process as defined in claim 1, wherein said semiconductor wafer is heated using light energy.

11. A process for forming thin oxide coatings on a semiconductor device, said process comprising the steps of:

placing a semiconductor wafer in a thermal processing chamber;

heating said semiconductor wafer in said chamber using light energy, said wafer being increased in temperature to a first target temperature at a first preselected rate, said preselected rate being an average rate ranging from about 50° C. per second to about 250° C. per second;

circulating a first gas within said chamber, said first gas containing an oxygen compound;

reacting said first gas with said semiconductor wafer to form an oxide coating while the temperature of said semiconductor wafer is being increased at said first preselected rate to said first target temperature, wherein said wafer is maintained at said first target temperature for less than about 1 second, said oxide coating having a thickness of up to about 100 angstroms;

cooling said semiconductor wafer;

reheating said semiconductor wafer in said chamber, said wafer being increased in temperature to a second target temperature at a second preselected rate, said second preselected rate being an average rate ranging from about 50° C. per second to about 250° C. per second;

circulating a second gas within said chamber, said second gas containing a nitrogen compound; and reacting said second gas with said oxide coating to form an oxynitride while the temperature of said semiconductor wafer is being increased at said second preselected rate to said second target temperature, wherein said wafer is maintained at said second target temperature for less than about 1 second.

12. A process for forming thin oxide coatings on a semiconductor device, said process comprising the steps of:

placing a semiconductor wafer in a thermal processing chamber;

heating said semiconductor wafer in said chamber, said wafer being increased in temperature to a target temperature at a preselected rate;

circulating a reactive gas within said chamber; and reacting said gas with said semiconductor wafer to form an oxide coating while the temperature of said semiconductor wafer is being increased at said preselected rate to said target temperature, wherein said wafer is maintained at said target temperature for less than about 1 second.

13. A process for forming thin oxide coatings on a semiconductor device, said process comprising the steps of:

placing a semiconductor wafer in a thermal processing chamber;

heating said semiconductor wafer in said chamber, said wafer being increased in temperature to a target temperature at a preselected rate;

circulating a reactive gas within said chamber, wherein said reactive gas comprises a material selected from the group consisting of molecular oxygen, ozone, steam and mixtures thereof;

reacting said gas with said semiconductor wafer to form an oxide coating while the temperature of said semiconductor wafer is being increased at said preselected rate to said target temperature, wherein said wafer is maintained at said target temperature for less than about 2 seconds;

cooling said semiconductor wafer after forming said oxide coating;

reheating said semiconductor wafer in said chamber, said wafer being increased in temperature to a second target temperature at a second preselected rate;

circulating a gas comprising a compound containing nitrogen within said chamber; and reacting said oxide coating with nitrogen contained in said gas to form an oxynitride while the temperature of said semiconductor wafer is being increased at said second preselected rate to said second target temperature, wherein said wafer is maintained at said second target temperature for less than about 2 seconds.

14. A process as defined in claim 13, wherein said compound containing nitrogen comprises a material selected from the group consisting of dinitrogen oxide, nitrogen oxide, nitric oxide, ammonia, molecular nitrogen, and mixtures thereof.

15. A process as defined in claim 13, further comprising the steps of:

subsequently cooling said semiconductor wafer after forming said oxynitride; and reoxidizing said semiconductor wafer by reacting said wafer with oxygen, ozone or mixtures thereof.

16. A process as defined in claim 15, wherein said reoxidation process comprises the steps of:

reheating said semiconductor wafer in said chamber, said wafer being increased in temperature to a third target temperature at a third preselected rate;

circulating a compound containing oxygen within said chamber; and reacting said compound containing oxygen with said semiconductor wafer while the temperature of said semiconductor wafer is being increased at said third preselected rate to said third target temperature, wherein said wafer is maintained at said third target temperature for less than about 2 seconds.

* * * * *